United States Patent
Lee et al.

(10) Patent No.: US 10,261,860 B2
(45) Date of Patent: Apr. 16, 2019

(54) SEMICONDUCTOR SYSTEMS

(71) Applicant: SK hynix Inc., Icheon-si, Gyeonggi-do (KR)

(72) Inventors: Sungeun Lee, Icheon-si (KR); Jung Hyun Kwon, Seoul (KR); Yong Ju Kim, Seoul (KR); Jae Sun Lee, Seoul (KR); Jingzhe Xu, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/611,151

(22) Filed: Jun. 1, 2017

(65) Prior Publication Data
US 2018/0060166 A1  Mar. 1, 2018

(30) Foreign Application Priority Data
Aug. 23, 2016 (KR) .......... 10-2016-0106757

(51) Int. Cl.
| | |
|---|---|
| *G11C 29/00* | (2006.01) |
| *G06F 11/10* | (2006.01) |
| *H03M 13/19* | (2006.01) |
| *H03M 13/15* | (2006.01) |
| *G11C 29/52* | (2006.01) |
| *G11C 29/04* | (2006.01) |

(52) U.S. Cl.
CPC .......... *G06F 11/1068* (2013.01); *G11C 29/52* (2013.01); *H03M 13/152* (2013.01); *H03M 13/19* (2013.01); *G11C 2029/0411* (2013.01)

(58) Field of Classification Search
CPC . G06F 11/1068; H03M 13/19; H03M 13/152; G11C 29/52
See application file for complete search history.

(56) References Cited

U.S. PATENT DOCUMENTS

| | | | | |
|---|---|---|---|---|
| 2005/0169344 A1* | 8/2005 | Hutter | ...................... | G01K 7/02 374/14 |
| 2009/0164704 A1* | 6/2009 | Kanade | ............... | G06F 11/1068 711/103 |
| 2010/0023800 A1 | 1/2010 | Harari et al. | | |
| 2010/0306619 A1* | 12/2010 | Yang | ................... | G06F 11/1072 714/758 |
| 2014/0372791 A1* | 12/2014 | Adachi | ............... | G06F 13/1689 714/5.1 |

FOREIGN PATENT DOCUMENTS

KR  1020150061393 A  6/2015

\* cited by examiner

*Primary Examiner* — Samir W Rizk
(74) *Attorney, Agent, or Firm* — William Park & Associates Ltd.

(57) ABSTRACT

A semiconductor system includes a host and a media controller. The host may generate first host parities from first host data based on an error check matrix. The media controller may include a first input/output (I/O) circuit and a second I/O circuit. The media controller may generate first media data and first media parities based on the first host data and the first host parities. The first I/O circuit may generate, based on the error check matrix, first internal data by correcting errors in the first host data using the first host parities. The second I/O circuit may generate the first media data and the first media parities from the first internal data.

5 Claims, 12 Drawing Sheets

FIG.2

| | C1 | C2 | C3 | C4 | C5 | C6 | C7 | C8 |
|---|---|---|---|---|---|---|---|---|
| R1 | 1 | 0 | 1 | 1 | 1 | 0 | 1 | 0 |
| R2 | 1 | 1 | 0 | 1 | 0 | 1 | 0 | 1 |
| R3 | 1 | 1 | 1 | 0 | 1 | 1 | 0 | 0 |
| R4 | 0 | 1 | 1 | 1 | 0 | 0 | 1 | 1 |

FIG.7

| | | | | |
|----|----|----|----|----|
| R1 | 1 | 0 | 1 | 1 |
| R2 | 1 | 1 | 0 | 1 |
| R3 | 1 | 1 | 1 | 0 |
| | C1 | C2 | C3 | C4 | ns # SEMICONDUCTOR SYSTEMS

CROSS-REFERENCE TO RELATED APPLICATIONS

The present application claims priority under 35 U.S.C. 119(a) to Korean Application No. 10-2016-0106757 filed on Aug. 23, 2016, which is incorporated herein by reference in its entirety.

BACKGROUND

1. Technical Field

Embodiments of the present disclosure generally relate to integrated circuits, and more particularly to semiconductor systems transmitting data with an error correction code.

2. Related Art

Semiconductor devices operating with double data rate (DDR) transfers data on both the rising and falling edges of clock signals to increase their data rate. Examples of this technique include a double data rate second generation (DDR2) and a double data rate third generation (DDR3) providing four bit data transfer and eight bit data transfers per cycle, respectively. An increase in data rate, however, may result in an increase in bit error rate. Therefore, many techniques are being used to tolerate high error rates and to improve the reliability of data transmission.

Examples of those techniques include generating codes capable of detecting occurrence of errors and/or correcting errors. The codes transmitted along with the data to improve the reliability of data transmission may include an error detection code (EDC), which is capable of detecting errors, and an error correction code (ECC), which is capable of correcting the errors and restoring the original data.

SUMMARY

According to an embodiment, a semiconductor system may include a host and a media controller. The host may generate first host parities from first host data based on an error check matrix. The media controller may include a first input/output (I/O) circuit and a second I/O circuit. The media controller may generate first media data and first media parities based on the first host data and the first host parities. The first I/O circuit may generate, based on the error check matrix, first internal data by correcting errors in the first host data using the first host parities. The second I/O circuit may generate the first media data and the first media parities from the first internal data.

According to an embodiment, a semiconductor system may include a host and a media controller. The host may generate first host parities from first host data based on an error check matrix. The media controller may include a first decoder and a first encoder. The media controller may generate first media data and first media parities based on the first host data and the first host parities. The first decoder may correct errors in the first host data using the first host parities based on the error check matrix and then output the corrected first host data as first internal data. The first encoder may generate second host data and second host parities from second internal data based on the error check matrix and then transmit the second host data and the second host parities to the host.

According to an embodiment, a semiconductor system may include a host and a media controller. The host may generate first host parities from first host data based on an error check matrix and extract row information from the error check matrix to output the row information. The media controller may include a first decoder and a first encoder, and may generate first media data and first media parities based on the first host data and the first host parities. The first decoder may correct errors in the first host data using the first host parities based on the error check matrix and then output the corrected first host data as first internal data. The first encoder may generate second host data and second host parities from second internal data based on the row information and then transmit the second host data and the second host parities to the host.

BRIEF DESCRIPTION OF THE DRAWINGS

Various embodiments of the present disclosure will become more apparent in view of the attached drawings and accompanying detailed description, in which:

FIG. 2 is a table illustrating an example of an error check matrix used in the semiconductor system of FIG. 1;

FIG. 7 is a table illustrating an example of first to third row information of an error check matrix used in the semiconductor system of FIG. 6;

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
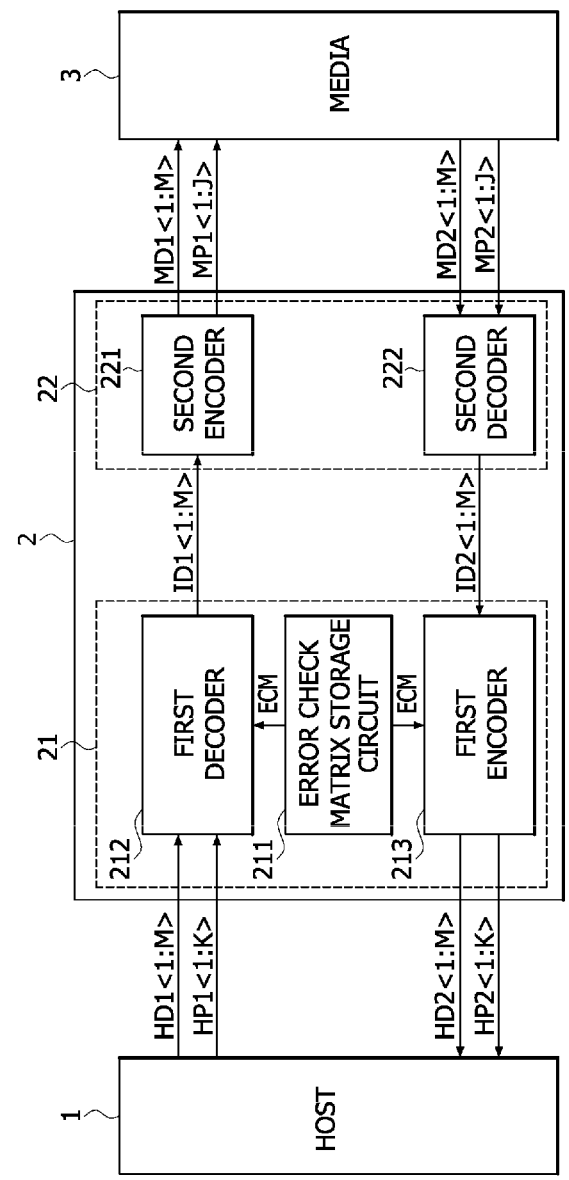
FIG. 1 is a diagram illustrating an example configuration of a semiconductor system according to an embodiment.

As illustrated in FIG. 1, a semiconductor system according to an embodiment may include a host 1, a media controller 2, and a medium 3.

The host 1 may apply first host data HD1<1:M> and first host parities HP1<1:K> to the media controller 2. The host 1 may generate the first host parities HP1<1:K> from the first host data HD1<1:M> according to an error correction code (ECC) scheme using, for example, a Hamming code. The Hamming code may be realized by an error check matrix for correcting errors in data. The ECC scheme is merely an example of various suitable schemes for generating the first host parities HP1<1:K> from the first host data HD1<1:M>. That is, any other code scheme for error correction may also be used in generating the first host parities HP1<1:K> according to embodiments. The host 1 may receive second host data HD2<1:M> and second host parities HP2<1:K> from the media controller 2. The host 1 may correct errors in the second host data HD2<1:M> using the second host data HD2<1:M> and the second host parities HP2<1:K> based on an error check matrix.

The media controller 2 may include a first input/output (I/O) circuit 21 and a second I/O circuit 22.

The first I/O circuit 21 may include an error check matrix storage circuit 211, a first decoder 212, and a first encoder 213. The error check matrix storage circuit 211 may store error check matrix information ECM, which is information on the error check matrix used in the host 1. The first decoder 212 may generate first internal data ID1<1:M> from the first host data HD1<1:M> and the first host parities HP1<1:K> based on the error check matrix information ECM. The first decoder 212 may correct errors in the first host data HD1<1:M> using the first host parities HP1<1:K>, and may output the corrected first host data as the first internal data ID1<1:M>. The first encoder 213 may generate the second host data HD2<1:M> and the second host parities HP2<1:K> from second internal data ID2<1:M>. The first encoder 213 may generate the second host parities HP2<1:K> for correcting errors in the second host data HD2<1:M> based on the error check matrix information ECM. The first encoder 213 may buffer the second internal data ID2<1:M> to output the buffered second internal data as the second host data HD2<1:M>. Configurations and operations of the first decoder 212 and first encoder 213 will be described more fully with reference to FIGS. 3, 4 and 5 later.

The second I/O circuit 22 may include a second encoder 221 and a second decoder 222. The second encoder 221 may generate first media data MD1<1:M> and first media parities MP1<1:J> from the first internal data ID1<1:M>. The second encoder 221 may generate the first media parities MP1<1:J> for correcting errors in the first media data MD1<1:M> using a Hamming code or a Bose-Chaudhuri-Hocquenghem (BCH) code. The second encoder 221 may buffer the first internal data ID1<1:M> to output the buffered first internal data as the first media data MD1<1:M>. The second decoder 222 may generate the second internal data ID2<1:M> from second media data MD2<1:M> and second media parities MP2<1:J> using a Hamming code or a BCH code. The second decoder 222 may correct errors in the second media data MD2<1:M> based on the second media parities MP2<1:J>, and may output the corrected second media data as the second internal data ID2<1:M>.

The medium 3 may correct errors in the first media data MD1<1:M> using the first media parities MP1<1:J> based on a Hamming code or a BCH code. The medium 3 may generate the second media parities MP2<1:J> for correcting errors in the second media data MD2<1:M> based on a Hamming code or a BCH code.

As described above, the media controller 2 of the semiconductor system may include the first I/O circuit 21 having the first decoder 212 and the first encoder 213. In the media controller 2, the first decoder 212 generates only the first internal data ID1<1:M> without generating any parity and transmits the first internal data ID1<1:M> to the second encoder 221. Thus, an increment of the number of bits in the first media parities MP1<1:J>, which is generated from the second encoder 221, may be minimized. In addition, the first I/O circuit 21 of the media controller 2 may include the first encoder 213 which is capable of generating the second host data HD2<1:M> and the second host parities HP2<1:K>. Thus, the number of bits in the second media parities MP2<1:J>, which is used in generating the second internal data ID2<1:M>, may be reduced. That is, the semiconductor system according an embodiment may have the first I/O circuit 21, which has the first decoder 212 and the first encoder 213, in the media controller 2, thereby minimizing the number of circuits necessary for storing the first and second media parities MP1<1:J> and MP2<1:J> in the medium 3. As a result, a data transmission efficiency of the semiconductor system may be improved.

In FIG. 2, an example of the error check matrix used in the semiconductor system of FIG. 1 is illustrated.

A first column vector (i.e., a first column line C1 of the error check matrix) may be set to '1110,' and a second column vector (i.e., a second column line C2 of the error check matrix) may be set to '0111.' In addition, a third column vector (i.e., a third column line C3 of the error check matrix) may be set to '1011,' and a fourth column vector (i.e., a fourth column line C4 of the error check matrix) may be set to '1101.' Moreover, a fifth column vector (i.e., a fifth column line C5 of the error check matrix) may be set to '1010,' and a sixth column vector (i.e., a sixth column line C6 of the error check matrix) may be set to '0110.' Furthermore, a seventh column vector (i.e., a seventh column line C7 of the error check matrix) may be set to '1001,' and a eighth column vector (i.e., an eighth column line C8 of the error check matrix) may be set to '0101.' In the column vectors, a value of "1" may correspond to a logic "high" level and a value of "0" may correspond to a logic "low" level.

In FIG. 2, a first row vector (i.e., a first row line R1 of the error check matrix) may be set to '10111010,' and a second row vector (i.e., a second row line R2 of the error check matrix) may be set to '11010101.' In addition, a third row vector (i.e., a third row line R3 of the error check matrix) may be set to '11101100,' and a fourth row vector (i.e., a fourth row line R4 of the error check matrix) may be set to '01110011.'

A four-bit parity signal and a four-bit syndrome signal may be generated by the error check matrix illustrated in FIG. 2, and a one-bit error included in the data may be corrected using the syndrome signal. The number of bits of the syndrome signal and the number of bits of data corrected by the syndrome signal may vary depending on embodiments.

Configurations and operations of the first decoder 212 and the first encoder 213, which generate the syndrome signal and the parity signal and correct errors in the data with the error check matrix of FIG. 2, will be described hereinafter in detail with reference to FIGS. 3, 4 and 5. The number of bits of various signals and data shown in FIGS. 3, 4 and 5 may vary depending on embodiments.

Figure 3:
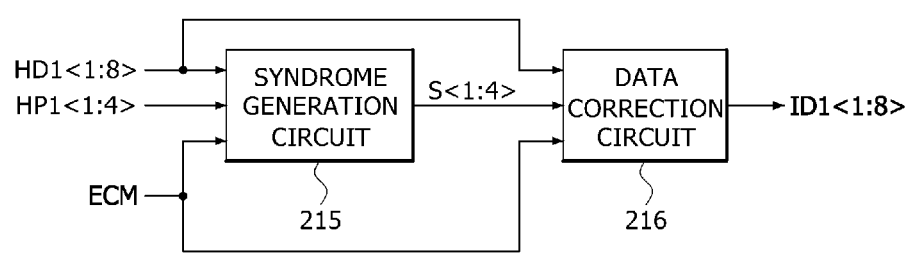
FIG. 3 is a diagram illustrating a configuration of an example of a first decoder included in the semiconductor system of FIG. 1.

As illustrated in FIG. 3, the first decoder 212 may include a syndrome generation circuit 215 and a data correction circuit 216.

The syndrome generation circuit 215 may generate a syndrome signal S<1:4> from the first host data HD1<1:8> and the first host parities HP1<1:4> based on the error check matrix information ECM. A configuration and an operation of the syndrome generation circuit 215 will be described more fully with reference to FIG. 4 later.

The data correction circuit 216 may correct errors in the first host data HD1<1:8> using the error check matrix information ECM and the syndrome signal S<1:4> to generate the first internal data ID1<1:8>. More specifically, the data correction circuit 216 may compare a logic level combination of the syndrome signal S<1:4> with column vectors of the error check matrix information ECM to correct the errors in the first host data HD1<1:8>. For example, if a logic level combination of the syndrome signal S<1:4> is consistent with the sixth column vector '0110,' it is determined that a sixth bit HD1<6> of the first host data HD1<1:8> is in error, and thus the data correction circuit 216 may correct an error included in the first host data HD1<1:8>.

Figure 4:
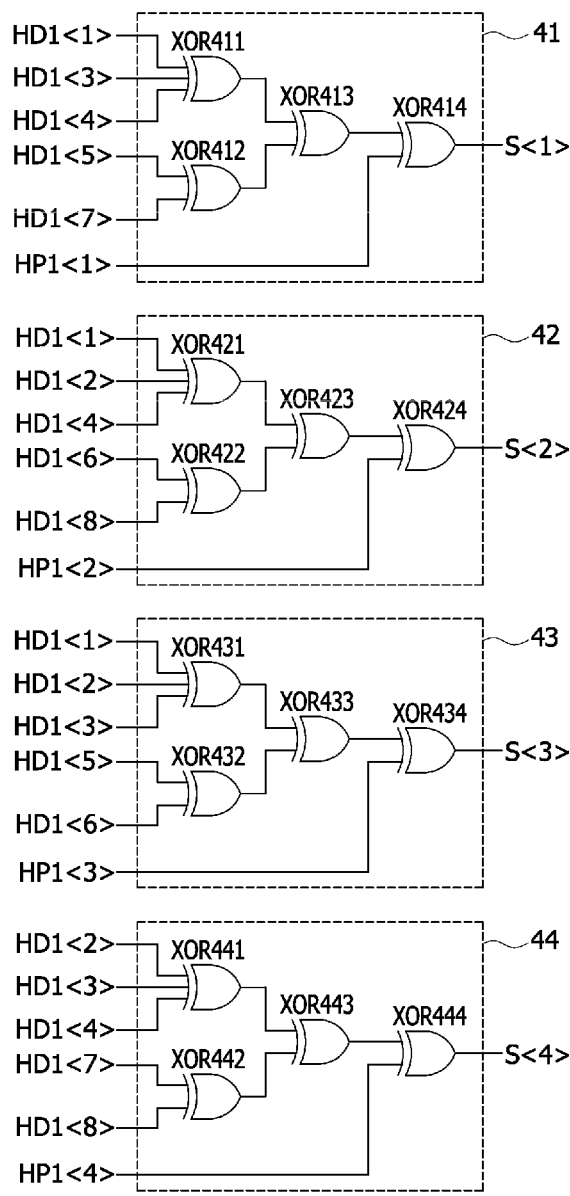
FIG. 4 is a diagram illustrating an example of a syndrome generation circuit included in the first decoder of FIG. 3.

Referring to FIG. 4, the syndrome generation circuit 215 may include a first syndrome generation circuit 41, a second syndrome generation circuit 42, a third syndrome generation circuit 43, and a fourth syndrome generation circuit 44.

The first syndrome generation circuit 41 may include exclusive OR gates XOR411, XOR412, XOR413, and XOR414. In the error check matrix illustrated in FIG. 2, since the first row vector (i.e., the first row line R1) is set to '10111010,' the first bit S<1> of the syndrome signal may be generated by performing exclusive OR operations on the first bit HD1<1> of the first host data, the third bit HD1<3> of the first host data, the fourth bit HD1<4> of the first host data, the fifth bit HD1<5> of the first host data, the seventh bit HD1<7> of the first host data, and the first bit HP1<1> of the first host parities.

The second syndrome generation circuit 42 may include exclusive OR gates XOR421, XOR422, XOR423, and XOR424. In the error check matrix illustrated in FIG. 2, since the second row vector (i.e., the second row line R2) is set to '11010101,' the second bit S<2> of the syndrome signal may be generated by performing exclusive OR operations on the first bit HD1<1> of the first host data, the second bit HD1<2> of the first host data, the fourth bit HD1<4> of the first host data, the sixth bit HD1<6> of the first host data, the eighth bit HD1<8> of the first host data, and the second bit HP1<2> of the first host parities.

The third syndrome generation circuit 43 may include exclusive OR gates XOR431, XOR432, XOR433, and XOR434. In the error check matrix illustrated in FIG. 2, since the third row vector (i.e., the third row line R3) is set to '11101100,' the third bit S<3> of the syndrome signal may be generated by performing exclusive OR operations on the first bit HD1<1> of the first host data, the second bit HD1<2> of the first host data, the third bit HD1<3> of the first host data, the fifth bit HD1<5> of the first host data, the sixth bit HD1<6> of the first host data, and the third bit HP1<3> of the first host parities.

The fourth syndrome generation circuit 44 may include exclusive OR gates XOR441, XOR442, XOR443, and XOR444. In the error check matrix illustrated in FIG. 2, since the fourth row vector (i.e., the fourth row line R4) is set to '01110011,' the fourth bit S<4> of the syndrome signal may be generated by performing exclusive OR operations on the second bit HD1<2> of the first host data, the third bit HD1<3> of the first host data, the fourth bit HD1<4> of the first host data, the seventh bit HD1<7> of the first host data, the eighth bit HD1<8> of the first host data, and the fourth bit HP1<4> of the first host parities.

Figure 5:
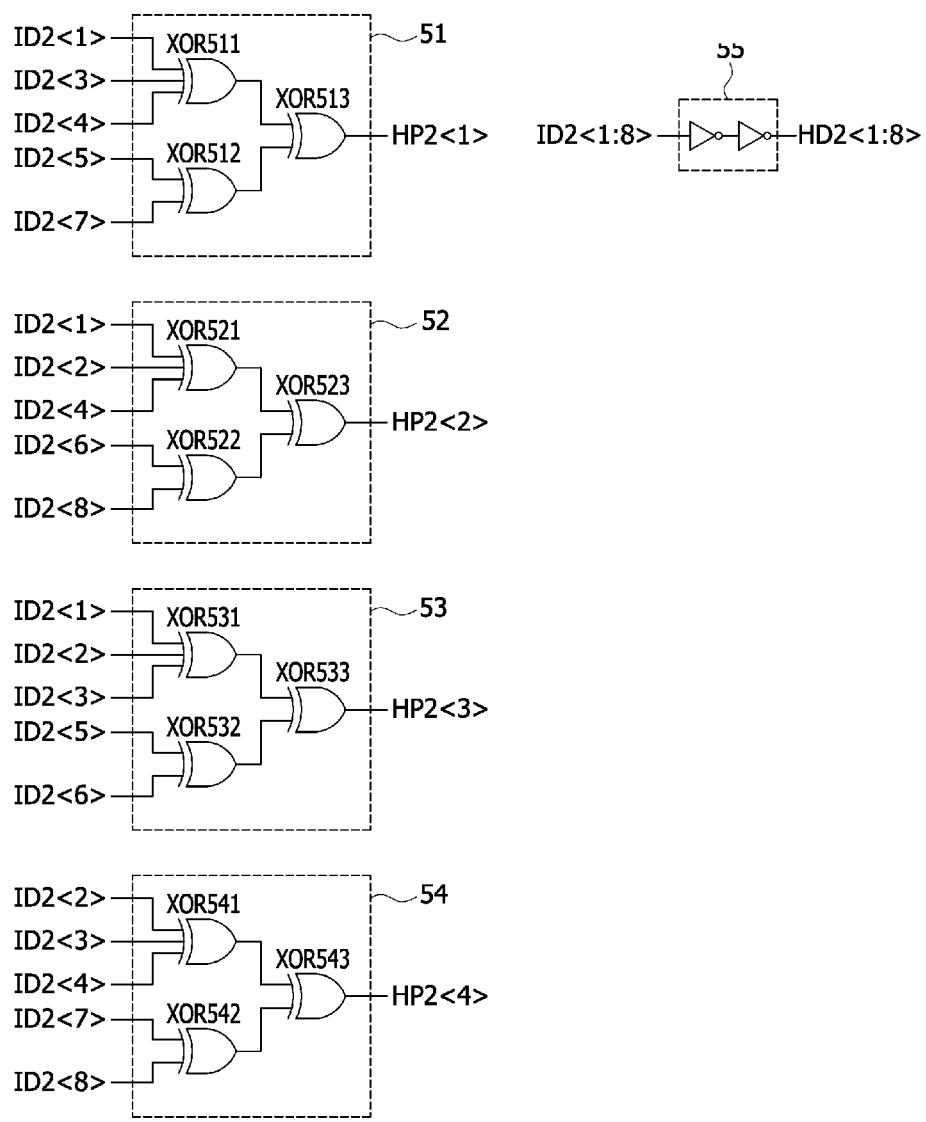
FIG. 5 is a diagram illustrating an example of a first encoder included in the semiconductor system of FIG. 1.

Referring to FIG. 5, the first encoder 213 may include a first parity generation circuit 51, a second parity generation circuit 52, a third parity generation circuit 53, a fourth parity generation circuit 54, and a host data generation circuit 55.

The first parity generation circuit 51 may include exclusive OR gates XOR511, XOR512, and XOR513. In the error check matrix illustrated in FIG. 2, since the first row vector (i.e., the first row line R1) is set to '10111010,' the first bit HP2<1> of the second host parities may be generated by performing exclusive OR operations on the first bit ID2<1> of the second internal data, the third bit ID2<3> of the second internal data, the fourth bit ID2<4> of the second internal data, the fifth bit ID2<5> of the second internal data, and the seventh bit ID2<7> of the second internal data.

The second parity generation circuit 52 may include exclusive OR gates XOR521, XOR522, and XOR523. In the error check matrix illustrated in FIG. 2, since the second row vector (i.e., the second row line R2) is set to '11010101,' the second bit HP2<2> of the second host parities may be generated by performing exclusive OR operations on the first bit ID2<1> of the second internal data, the second bit ID2<2> of the second internal data, the fourth bit ID2<4> of the second internal data, the sixth bit ID2<6> of the second internal data, and the eighth bit ID2<8> of the second internal data.

The third parity generation circuit 53 may include exclusive OR gates XOR531, XOR532, and XOR533. In the error check matrix illustrated in FIG. 2, since the third row vector (i.e., the third row line R3) is set to '11101100,' the third bit HP2<3> of the second host parities may be generated by performing exclusive OR operations on the first bit ID2<1> of the second internal data, the second bit ID2<2> of the second internal data, the third bit ID2<3> of the second internal data, the fifth bit ID2<5> of the second internal data, and the sixth bit ID2<6> of the second internal data.

The fourth parity generation circuit 54 may include exclusive OR gates XOR541, XOR542, and XOR543. In the error check matrix illustrated in FIG. 2, since the fourth row vector (i.e., the fourth row line R4) is set to '01110011,' the fourth bit HP2<4> of the second host parities may be generated by performing exclusive OR operations on the second bit ID2<2> of the second internal data, the third bit ID2<3> of the second internal data, the fourth bit ID2<4> of the second internal data, the seventh bit ID2<7> of the second internal data, and the eighth bit ID2<8> of the second internal data.

The host data generation circuit 55 may buffer the second internal data ID2<1:8> to generate the second host data HD2<1:8>. The number of inverters included in the host data generation circuit 55 may vary depending on embodiments. In some embodiments, the second internal data ID2<1:8> may bypass the host data generation circuit 55 and may be output as the second host data HD2<1:8>.

Figure 6:
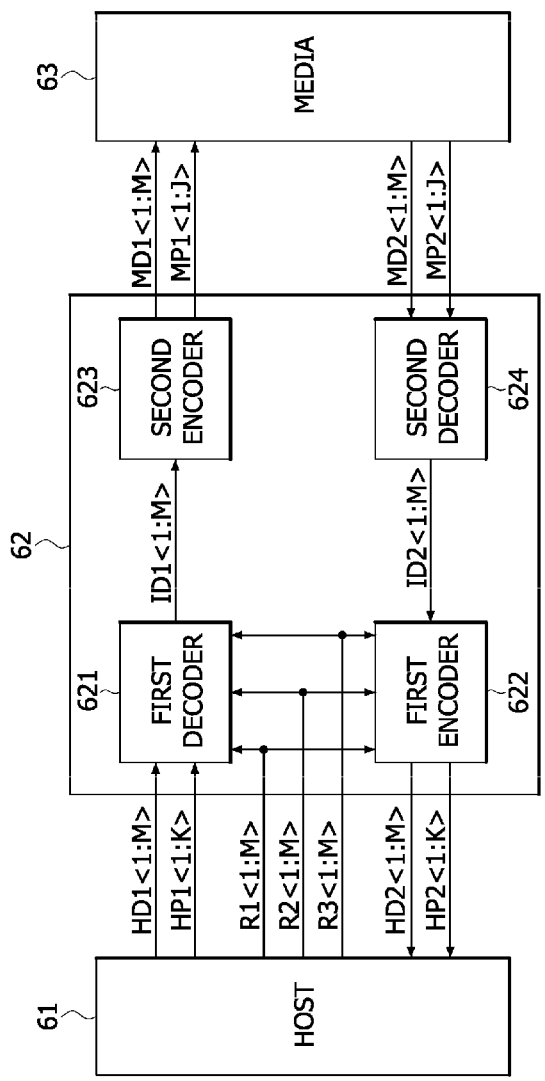
FIG. 6 is a diagram illustrating an example configuration of a semiconductor system according to an embodiment.

As illustrated in FIG. 6, a semiconductor system according to an embodiment may include a host 61, a media controller 62 and a medium 63.

The host 61 may apply first host data HD1<1:M> and first host parities HP1<1:K> to the media controller 62. The host 61 may generate the first host parities HP1<1:K> from the first host data HD1<1:M> according to an error correction code (ECC) scheme using, for example, a Hamming code. The Hamming code may be realized by an error check matrix for correcting errors in data. The host 61 may apply first row information R1<1:M>, second row information R2<1:M> and third row information R3<1:M> included in the error check matrix to the media controller 62. The first row information R1<1:M> may include information on a first row line of the error check matrix. The second row information R2<1:M> may include information on a second row line of the error check matrix. The third row information R3<1:M> may include information on a third row line of the error check matrix. The host 61 may receive second host data HD2<1:M> and second host parities HP2<1:K> from the media controller 62. The host 61 may correct errors in the second host data HD2<1:M> using the second host data HD2<1:M> and the second host parities HP2<1:K> based on the error check matrix.

The media controller 62 may include a first decoder 621, a first encoder 622, a second encoder 623, and a second decoder 624.

The first decoder 621 may generate first internal data ID1<1:M> from the first host data HD1<1:M> and the first host parities HP1<1:K> based on the first row information R1<1:M>, the second row information R2<1:M>, and the third row information R3<1:M>. The first decoder 621 may correct errors in the first host data HD1<1:M> using the first host parities HP1<1:K>, and may output the corrected first host data as the first internal data ID1<1:M>.

The first encoder 622 may generate the second host data HD2<1:M> and the second host parities HP2<1:K> from second internal data ID2<1:M>. The first encoder 622 may generate the second host parities HP2<1:K> for correcting errors in the second host data HD2<1:M> based on the first row information R1<1:M>, the second row information R2<1:M>, and the third row information R3<1:M>. The first encoder 622 may buffer the second internal data ID2<1:M> to output the buffered second internal data as the second host data HD2<1:M>. Configurations and operations of the first decoder 621 and first encoder 622 will be described more fully with reference to FIGS. 8, 9 and 10 later.

The second encoder 623 may generate first media data MD1<1:M> and first media parities MP1<1:J> from the first internal data ID1<1:M>. The second encoder 623 may generate the first media parities MP1<1:J> for correcting errors in the first media data MD1<1:M> using a Hamming code or a Bose-Chaudhuri-Hocquenghem (BCH) code. The second encoder 623 may buffer the first internal data ID1<1:M> to output the buffered first internal data as the first media data MD1<1:M>.

The second decoder 624 may generate the second internal data ID2<1:M> from second media data MD2<1:M> and second media parities MP2<1:J> using a Hamming code or a BCH code. The second decoder 624 may correct errors in the second media data MD2<1:M> based on the second media parities MP2<1:J>, and may output the corrected second media data as the second internal data ID2<1:M>.

The medium 63 may correct errors in the first media data MD1<1:M> using the first media parities MP1<1:J> based on a Hamming code or a BCH code. The medium 63 may generate the second media parities MP2<1:J> for correcting errors in the second media data MD2<1:M> based on a Hamming code or a BCH code.

As described above, the media controller 62 of the semiconductor system may include the first decoder 621 and the first encoder 622. In the media controller 62, the first decoder 621 generates only the first internal data ID1<1:M> without generating any parity and transmits the first internal data ID1<1:M> to the second encoder 623. Thus, an increment of the number of bits in the first media parities MP1<1:J>, which is generated from the second encoder 623, may be minimized. In addition, the media controller 62 may include the first encoder 622 which is capable of generating the second host data HD2<1:M> and the second host parities HP2<1:K>. Thus, the number of bits in the second media parities MP2<1:J>, which is used in generating the second internal data ID2<1:M>, may be reduced. That is, the semiconductor system according an embodiment may have the first decoder 621 and the first encoder 622 in the media controller 62, thereby minimizing the number of circuits necessary for storing the first and second media parities MP1<1:J> and MP2<1:J> in the medium 63. As a result, a data transmission efficiency of the semiconductor system may be improved.

Figure 7:
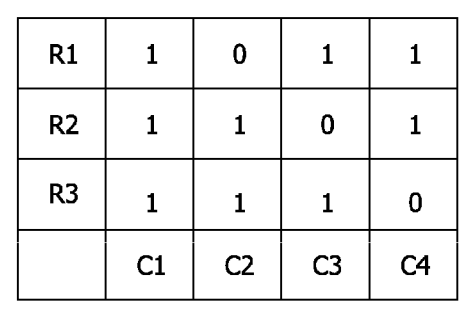

In FIG. 7, an example of the error check matrix used in the semiconductor system of FIG. 6 is illustrated.

A first column vector (i.e., a first column line C1 of the error check matrix) may be set to '111,' and a second column vector (i.e., a second column line C2 of the error check matrix) may be set to '011.' In addition, a third column vector (i.e., a third column line C3 of the error check matrix) may be set '101,' and a fourth column vector (i.e., a fourth column line C4 of the error check matrix) may be set to '110.' In the column vectors, a value of "1" may correspond to a logic "high" level and a value of "0" may correspond to a logic "low" level.

As illustrated in FIG. 7, a first row vector (i.e., a first row line R1 of the error check matrix) may be set to '1011,' a second row vector (i.e., a second row line R2 of the error check matrix) may be set to '1101,' and a third row vector (i.e., a third row line R3 of the error check matrix) may be set to '1110.' The first row information R1<1:M> may be set to a logic level combination of '1011' in the first row line R1 of the error check matrix, the second row information R2<1:M> may be set to a logic level combination of '1101' in the second row line R2 of the error check matrix, and the third row information R3<1:M> may be set to a logic level combination of '1110' in the third row line R3 of the error check matrix.

A three-bit parity signal and a three-bit syndrome signal may be generated by the error check matrix illustrated in FIG. 7, and a one-bit error included in the data may be corrected using the syndrome signal. Configurations and operations of the first decoder 621 and the first encoder 622, which generate the syndrome signal and the parity signal and correct errors in the data with the error check matrix of FIG. 7, will be described hereinafter in detail with reference to FIGS. 8, 9 and 10.

Figure 8:
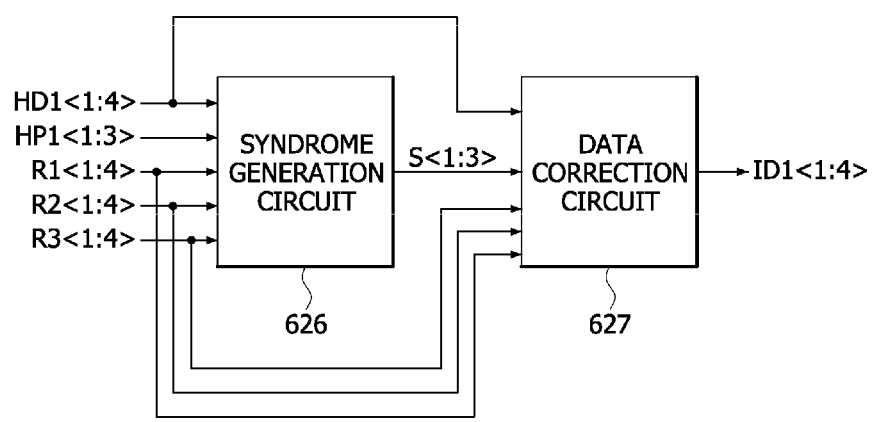
FIG. 8 is a diagram illustrating a configuration of an example of a first decoder included in the semiconductor system of FIG. 6.

As illustrated in FIG. 8, the first decoder 621 may include a syndrome generation circuit 626 and a data correction circuit 627.

The syndrome generation circuit 626 may generate a syndrome signal S<1:3> from the first host data HD1<1:4> and the first host parities HP1<1:3> based on the first row information R1<1:4>, the second row information R2<1:4> and the third row information R3<1:4>. A configuration and an operation of the syndrome generation circuit 626 will be described more fully with reference to FIG. 9 later.

The data correction circuit 627 may correct errors in the first host data HD1<1:4> using the first to third row information R1<1:4>, R2<1:4> and R3<1:4> and the syndrome signal S<1:3> to generate the first internal data ID1<1:4>. More specifically, the data correction circuit 627 may compare a logic level combination of the syndrome signal S<1:3> with column vectors of the error check matrix realized by the first to third row information R1<1:4>, R2<1:4> and R3<1:4> to correct the errors in the first host data HD1<1:4>. For example, if a logic level combination of the syndrome signal S<1:3> is consistent with the third column vector '101,' it is determined that a third bit HD1<3> of the first host data is in error, and thus the data correction circuit 627 may correct an error included in the first host data HD1<1:4>.

Figure 9:
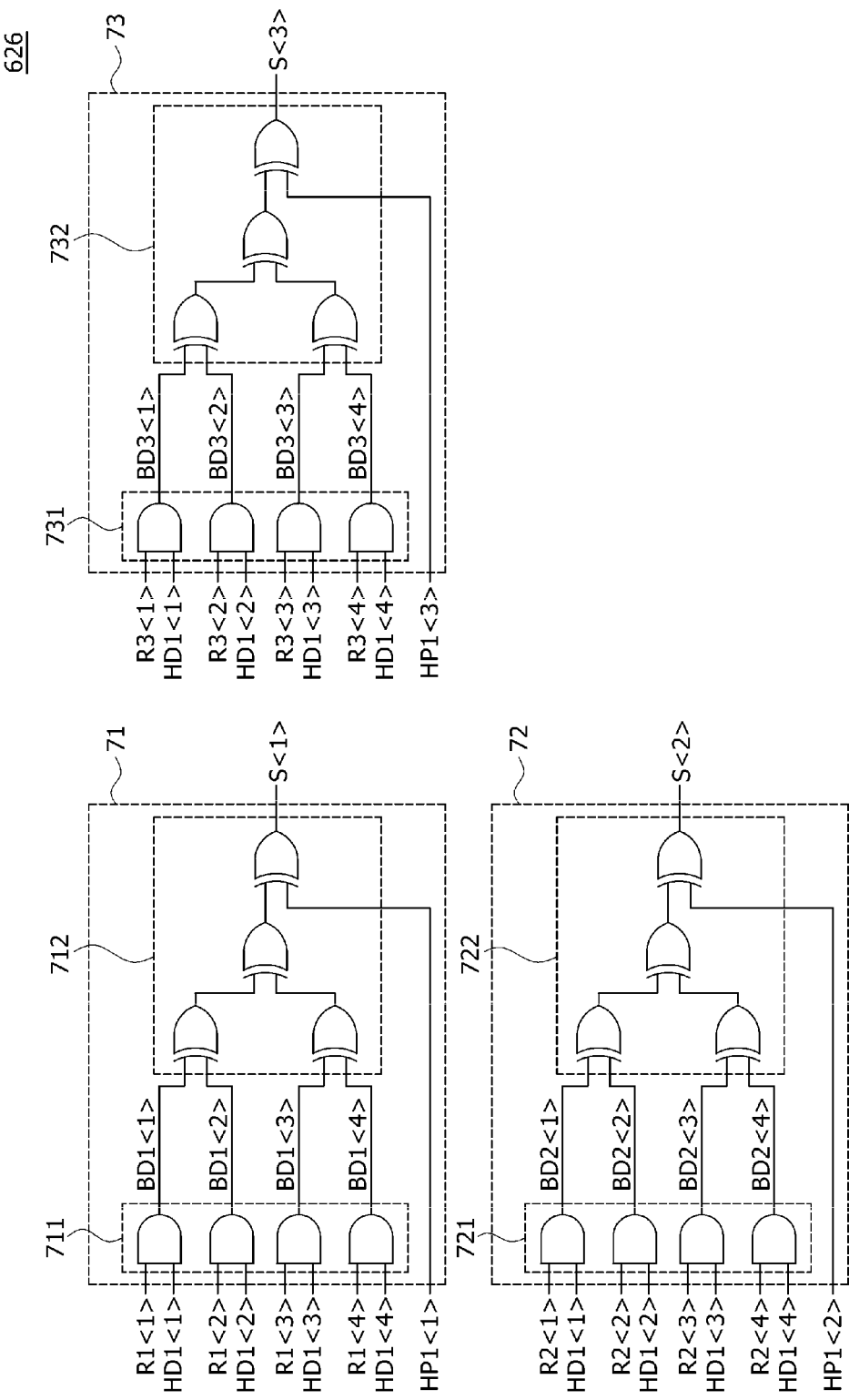
FIG. 9 is a diagram illustrating an example of a syndrome generation circuit included in the first decoder of FIG. 8.

Referring to FIG. 9, the syndrome generation circuit 626 may include a first syndrome generation circuit 71, a second syndrome generation circuit 72, and a third syndrome generation circuit 73.

The first syndrome generation circuit 71 may include a first data buffer 711 and a first syndrome output circuit 712.

The first data buffer 711 may perform a logical AND operation on the first bit R1<1> of the first row information and the first bit HD1<1> of the first host data to generate a first bit BD1<1> of first buffer data. The first data buffer 711 may perform a logical AND operation on the second bit R1<2> of the first row information and the second bit HD1<2> of the first host data to generate a second bit BD1<2> of the first buffer data. The first data buffer 711 may perform a logical AND operation on the third bit R1<3> of the first row information and the third bit HD1<3> of the first host data to generate a third bit BD1<3> of the first buffer data. The first data buffer 711 may perform a logical AND operation on the fourth bit R1<4> of the first row information and the fourth bit HD1<4> of the first host data to generate a fourth bit BD1<4> of the first buffer data.

The first syndrome output circuit 712 may perform exclusive OR operations on the first bit BD1<1> of the first buffer data, the second bit BD1<2> of the first buffer data, the third bit BD1<3> of the first buffer data, the fourth bit BD1<4> of the first buffer data, and the first bit HP1<1> of the first host parities to generate the first bit S<1> of the syndrome signal S<1:3>.

In the error check matrix illustrated in FIG. 7, the first row information R1<1:4> may be set to a logic level combination of '1011.' Thus, the first bit R1<1> of the first row information may have a logic "high" level, the second bit R1<2> of the first row information may have a logic "low" level, the third bit R1<3> of the first row information may have a logic "high" level, and the fourth bit R1<4> of the first row information may have a logic "high" level. The first bit BD1<1> of the first buffer data output from the first data buffer 711 may be generated by buffering the first bit HD1<1> of the first host data. The second bit BD1<2> of the first buffer data output from the first data buffer 711 may have a logic "low" level because the second bit R1<2> of the first row information has a logic "low" level. The third bit BD1<3> of the first buffer data output from the first data buffer 711 may be generated by buffering the third bit HD1<3> of the first host data. The fourth bit BD1<4> of the first buffer data output from the first data buffer 711 may be generated by buffering the fourth bit HD1<4> of the first host data. The first bit S<1> of the syndrome signal S<1:3> may be generated by performing exclusive OR operations on the first bit BD1<1> of the first buffer data, the second bit BD1<2> of the first buffer data, the third bit BD1<3> of the first buffer data, the fourth bit BD1<4> of the first buffer data, and the first bit HP1<1> of the first host parities.

The second syndrome generation circuit 72 may include a second data buffer 721 and a second syndrome output circuit 722.

The second data buffer 721 may perform a logical AND operation on the first bit R2<1> of the second row information and the first bit HD1<1> of the first host data to generate a first bit BD2<1> of second buffer data. The second data buffer 721 may perform a logical AND operation on the second bit R2<2> of the second row information and the second bit HD1<2> of the first host data to generate a second bit BD2<2> of the second buffer data. The second data buffer 721 may perform a logical AND operation on the third bit R2<3> of the second row information and the third bit HD1<3> of the first host data to generate a third bit BD2<3> of the second buffer data. The second data buffer 721 may perform a logical AND operation on the fourth bit R2<4> of the second row information and the fourth bit HD1<4> of the first host data to generate a fourth bit BD2<4> of the second buffer data.

The second syndrome output circuit 722 may perform exclusive OR operations on the first bit BD2<1> of the second buffer data, the second bit BD2<2> of the second buffer data, the third bit BD2<3> of the second buffer data, the fourth bit BD2<4> of the second buffer data, and the second bit HP1<2> of the first host parities to generate the second bit S<2> of the syndrome signal S<1:3>.

In the error check matrix illustrated in FIG. 7, the second row information R2<1:4> may be set to a logic level combination of '1101.' Thus, the first bit R2<1> of the second row information may have a logic "high" level, the second bit R2<2> of the second row information may have a logic "high" level, the third bit R2<3> of the second row information may have a logic "low" level, and the fourth bit R2<4> of the second row information may have a logic "high" level. The first bit BD2<1> of the second buffer data output from the second data buffer 721 may be generated by buffering the first bit HD1<1> of the first host data. The second bit BD2<2> of the second buffer data output from the second data buffer 721 may be generated by buffering the second bit HD1<2> of the first host data. The third bit BD2<3> of the second buffer data output from the second data buffer 721 may be generated to have a logic "low" level because the third bit R2<3> of the second row information has a logic "low" level. The fourth bit BD2<4> of the second buffer data output from the second data buffer 721 may be generated by buffering the fourth bit HD1<4> of the first host data. The second bit S<2> of the syndrome signal S<1:3> may be generated by performing exclusive OR operations on the first bit BD2<1> of the second buffer data, the second bit BD2<2> of the second buffer data, the third bit BD2<3> of the second buffer data, the fourth bit BD2<4> of the second buffer data, and the second bit HP1<2> of the first host parities.

The third syndrome generation circuit 73 may include a third data buffer 731 and a third syndrome output circuit 732.

The third data buffer 731 may perform a logical AND operation on the first bit R3<1> of the third row information and the first bit HD1<1> of the first host data to generate a first bit BD3<1> of third buffer data. The third data buffer 731 may perform a logical AND operation on the second bit R3<2> of the third row information and the second bit HD1<2> of the first host data to generate a second bit BD3<2> of the third buffer data. The third data buffer 731 may perform a logical AND operation of the third bit R3<3> on the third row information and the third bit HD1<3> of the first host data to generate a third bit BD3<3> of the third buffer data. The third data buffer 731 may perform a logical AND operation on the fourth bit R3<4> of the third row information and the fourth bit HD1<4> of the first host data to generate a fourth bit BD3<4> of the third buffer data.

The third syndrome output circuit 732 may perform exclusive OR operations on the first bit BD3<1> of the third buffer data, the second bit BD3<2> of the third buffer data, the third bit BD3<3> of the third buffer data, the fourth bit BD3<4> of the third buffer data, and the third bit HP1<3> of the first host parities to generate the third bit S<3> of the syndrome signal S<1:3>.

In the error check matrix illustrated in FIG. 7, the third row information R3<1:4> may be set to a logic level combination of '1110.' Thus, the first bit R3<1> of the third row information may have a logic "high" level, the second bit R3<2> of the third row information may have a logic "high" level, the third bit R3<3> of the third row information may have a logic "high" level, and the fourth bit R3<4> of the third row information may have a logic "low" level. The first bit BD3<1> of the third buffer data output from the third data buffer 731 may be generated by buffering the first bit HD1<1> of the first host data. The second bit BD3<2> of the third buffer data output from the third data buffer 731 may be generated by buffering the second bit HD1<2> of the first host data. The third bit BD3<3> of the third buffer data output from the third data buffer 731 may be generated by buffering the third bit HD1<3> of the first host data. The fourth bit BD3<4> of the third buffer data output from the third data buffer 731 may be generated to have a logic "low" level because the fourth bit R3<4> of the third row information has a logic "low" level. The third bit S<3> of the syndrome signal S<1:3> may be generated by performing exclusive OR operations on the first bit BD3<1> of the third buffer data, the second bit BD3<2> of the third buffer data, the third bit BD3<3> of the third buffer data, the fourth bit BD3<4> of the third buffer data, and the third bit HP1<3> of the first host parities.

Figure 10:
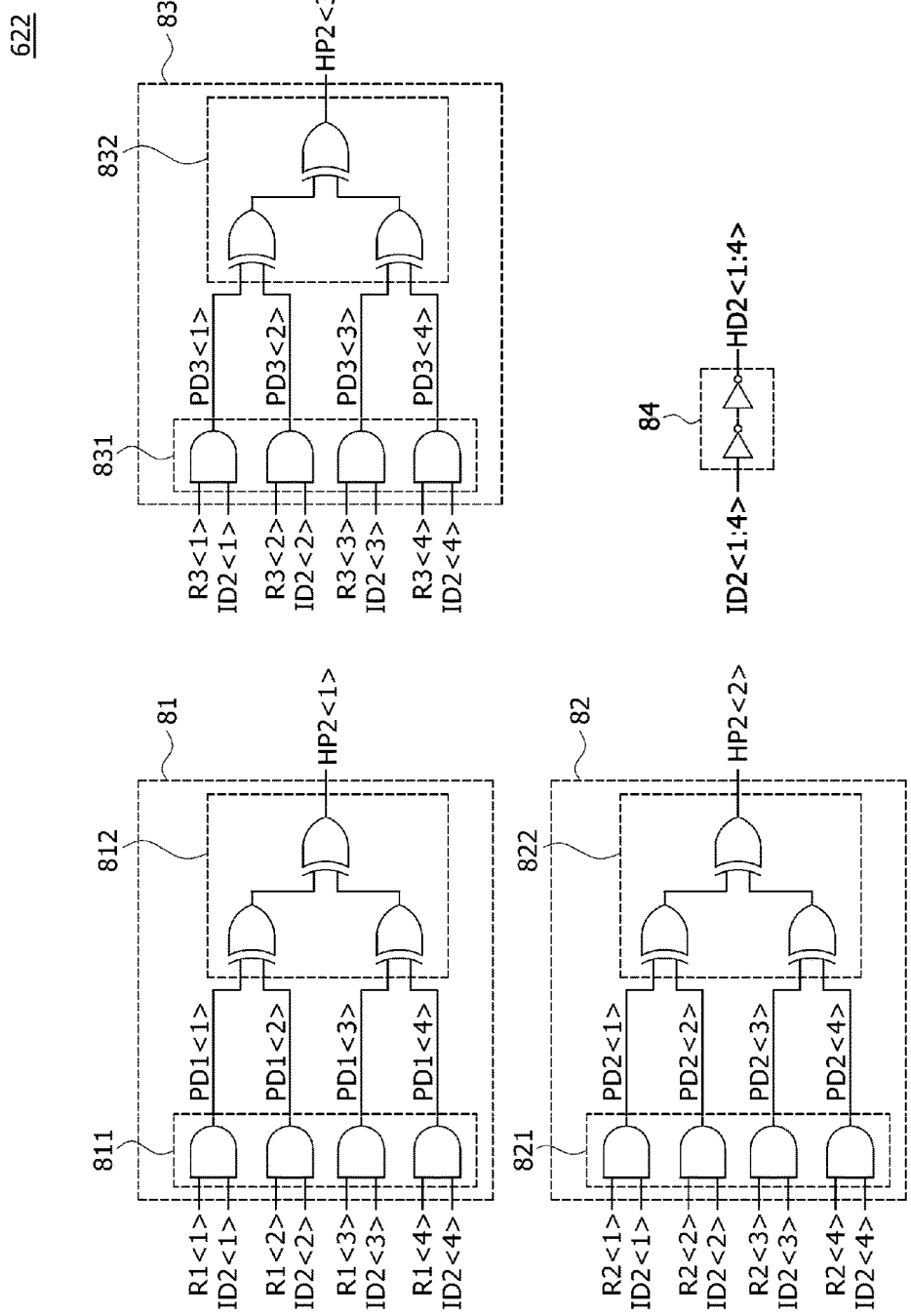
FIG. 10 is a diagram illustrating an example of a first encoder included in the semiconductor system of FIG. 6.

Referring to FIG. 10, the first encoder 622 may include a first parity generation circuit 81, a second parity generation circuit 82, a third parity generation circuit 83, and a host data generation circuit 84.

The first parity generation circuit 81 may include a first parity buffer 811 and a first parity output circuit 812.

The first parity buffer 811 may perform a logical AND operation on the first bit R1<1> of the first row information and the first bit ID2<1> of the second internal data to generate a first bit PD1<1> of first buffer parities. The first parity buffer 811 may perform a logical AND operation on the second bit R1<2> of the first row information and the second bit ID2<2> of the second internal data to generate a second bit PD1<2> of the first buffer parities. The first parity buffer 811 may perform a logical AND operation on the third bit R1<3> of the first row information and the third bit ID2<3> of the second internal data to generate a third bit PD1<3> of the first buffer parities. The first parity buffer 811 may perform a logical AND operation on the fourth bit R1<4> of the first row information and the fourth bit ID2<4> of the second internal data to generate a fourth bit PD1<4> of the first buffer parities.

The first parity output circuit 812 may perform exclusive OR operations on the first bit PD1<1> of the first buffer parities, the second bit PD1<2> of the first buffer parities, the third bit PD1<3> of the first buffer parities, and the fourth bit PD1<4> of the first buffer parities to generate the first bit HP2<1> of the second host parities HP2<1:3>.

In the error check matrix illustrated in FIG. 2, the first row information R1<1:4> may be set to a logic level combination of '1011.' Thus, the first bit R1<1> of the first row information may have a logic "high" level, the second bit R1<2> of the first row information may have a logic "low" level, the third bit R1<3> of the first row information may have a logic "high" level, and the fourth bit R1<4> of the first row information may have a logic "high" level. The first bit PD1<1> of the first buffer parities output from the first parity buffer 811 may be generated by buffering the first bit ID2<1> of the second internal data. The second bit PD1<2> of the first buffer parities output from the first parity buffer 811 may have a logic "low" level because the second bit R1<2> of the first row information has a logic "low" level. The third bit PD1<3> of the first buffer parities output from the first parity buffer 811 may be generated by buffering the third bit ID2<3> of the second internal data. The fourth bit PD1<4> of the first buffer parities output from the first parity buffer 811 may be generated by buffering the fourth bit ID2<4> of the second internal data. The first bit HP2<1> of the second host parities HP2<1:3> may be generated by performing exclusive OR operations on the first bit PD1<1> of the first buffer parities, the second bit PD1<2> of the first buffer parities, the third bit PD1<3> of the first buffer parities, and the fourth bit PD1<4> of the first buffer parities.

The second parity generation circuit 82 may include a second parity buffer 821 and a second parity output circuit 822.

The second parity buffer 821 may perform a logical AND operation on the first bit R2<1> of the second row information and the first bit ID2<1> of the second internal data to generate a first bit PD2<1> of second buffer parities. The second parity buffer 821 may perform a logical AND operation on the second bit R2<2> of the second row information and the second bit ID2<2> of the second internal data to generate a second bit PD2<2> of the second buffer parities. The second parity buffer 821 may perform a logical AND operation on the third bit R2<3> of the second row information and the third bit ID2<3> of the second internal data to generate a third bit PD2<3> of the second buffer parities. The second parity buffer 821 may perform a logical AND operation on the fourth bit R2<4> of the second row information and the fourth bit ID2<4> of the second internal data to generate a fourth bit PD2<4> of the second buffer parities.

The second parity output circuit 822 may perform exclusive OR operations on the first bit PD2<1> of the second buffer parities, the second bit PD2<2> of the second buffer parities, the third bit PD2<3> of the second buffer parities, and the fourth bit PD2<4> of the second buffer parities to generate the second bit HP2<2> of the second host parities HP2<1:3>.

In the error check matrix illustrated in FIG. 7, the second row information R2<1:4> may be set to a logic level combination of '1101.' Thus, the first bit R2<1> of the second row information may have a logic "high" level, the second bit R2<2> of the second row information may have a logic "high" level, the third bit R2<3> of the second row information may have a logic "low" level, and the fourth bit R2<4> of the second row information may have a logic "high" level. The first bit PD2<1> of the second buffer parities output from the second parity buffer 821 may be generated by buffering the first bit ID2<1> of the second internal data. The second bit PD2<2> of the second buffer parities output from the second parity buffer 821 may be generated by buffering the second bit ID2<2> of the second internal data. The third bit PD2<3> of the second buffer parities output from the second parity buffer 821 may have a logic "low" level because the third bit R2<3> of the second row information has a logic "low" level. The fourth bit PD2<4> of the second buffer parities output from the second parity buffer 821 may be generated by buffering the fourth bit ID2<4> of the second internal data. The second bit HP2<2> of the second host parities HP2<1:3> may be generated by performing exclusive OR operations on the first bit PD2<1> of the second buffer parities, the second bit PD2<2> of the second buffer parities, the third bit PD2<3> of the second buffer parities, and the fourth bit PD2<4> of the second buffer parities.

The third parity generation circuit 83 may include a third parity buffer 831 and a third parity output circuit 832.

The third parity buffer 831 may perform a logical AND operation on the first bit R3<1> of the third row information and the first bit ID2<1> of the second internal data to generate a first bit PD3<1> of third buffer parities. The third parity buffer 831 may perform a logical AND operation on the second bit R3<2> of the third row information and the second bit ID2<2> of the second internal data to generate a second bit PD3<2> of the third buffer parities. The third parity buffer 831 may perform a logical AND operation on the third bit R3<3> of the third row information and the third bit ID2<3> of the second internal data to generate a third bit PD3<3> of the third buffer parities. The third parity buffer 831 may perform a logical AND operation on the fourth bit R3<4> of the third row information and the fourth bit ID2<4> of the second internal data to generate a fourth bit PD3<4> of the third buffer parities.

The third parity output circuit 832 may perform exclusive OR operations on the first bit PD3<1> of the third buffer parities, the second bit PD3<2> of the third buffer parities, the third bit PD3<3> of the third buffer parities, and the fourth bit PD3<4> of the third buffer parities to generate the third bit HP2<3> of the second host parities HP2<1:3>.

In the error check matrix illustrated in FIG. 7, the third row information R3<1:4> may be set to a logic level combination of '1110.' Thus, the first bit R3<1> of the third row information may have a logic "high" level, the second bit R3<2> of the third row information may have a logic "high" level, the third bit R3<3> of the third row information may have a logic "high" level, and the fourth bit R3<4> of the third row information may have a logic "low" level. The first bit PD3<1> of the third buffer parities output from the third parity buffer 831 may be generated by buffering the first bit ID2<1> of the second internal data. The second bit PD3<2> of the third buffer parities output from the third parity buffer 831 may be generated by buffering the second bit ID2<2> of the second internal data. The third bit PD3<3> of the third buffer parities output from the third parity buffer 831 may be generated by buffering the third bit ID2<3> of the second internal data. The fourth bit PD3<4> of the third buffer parities output from the third parity buffer 831 may have a logic "low" level because the fourth bit R3<4> of the third row information has a logic "low" level. The third bit HP2<3> of the second host parities HP2<1:3> may be generated by performing exclusive OR operations on the first bit PD3<1> of the third buffer parities, the second bit PD3<2> of the third buffer parities, the third bit PD3<3> of the third buffer parities, and the fourth bit PD3<4> of the third buffer parities.

The host data generation circuit 84 may generate the second host data HD2<1:4> by buffering the second internal data ID2<1:4>. The number of inverters included in the host data generation circuit 84 may vary depending on embodiments. In some embodiments, the second internal data ID2<1:4> may bypass the host data generation circuit 84 to be output as the second host data HD2<1:4>.

Figure 11:
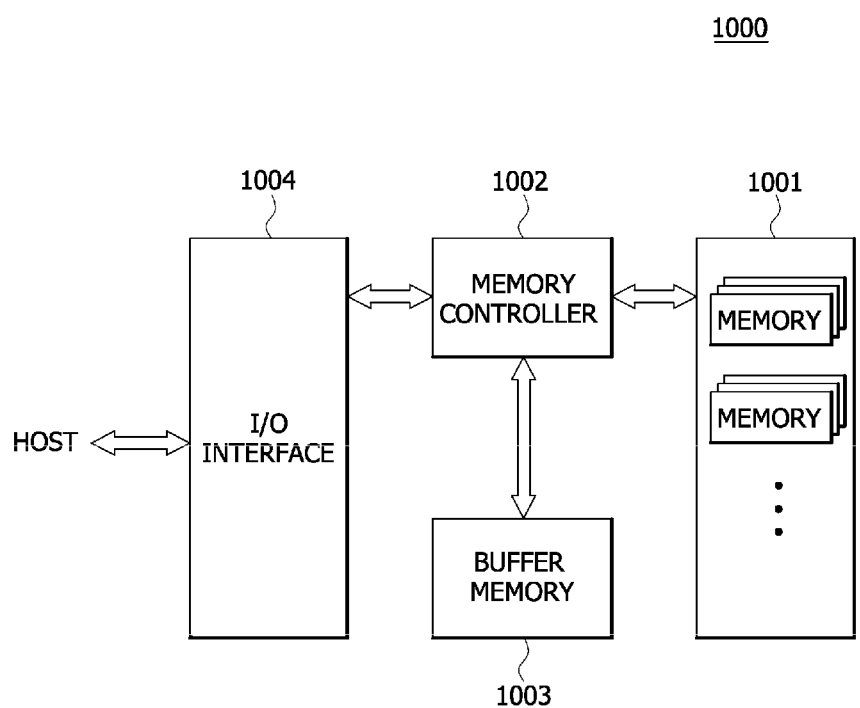
FIG. 11 is a diagram illustrating an example configuration of an electronic system employing at least one of the semiconductor systems shown in FIGS. 1 and 6.

At least one of the semiconductor systems described with reference to FIGS. 1 to 10 may be applied to an electronic system such as a memory system, a graphic system, a computing system, a mobile system, or the like. For example, as illustrated in FIG. 11, an electronic system 1000 according an embodiment may include a data storage circuit 1001, a memory controller 1002, a buffer memory 1003, and an input/output (I/O) interface 1004.

The data storage circuit 1001 may store data output from the memory controller 1002 according to a control signal generated from the memory controller 1002, and the memory controller 1002 may read out the stored data. The data storage circuit 1001 may include the medium 3 of FIG. 1 or the medium 63 of FIG. 6. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command output from an external device (e.g., a host device) through the I/O interface 1004. The memory controller 1002 may decode the command output from the host device to control an operation for inputting data into the data storage circuit 1001 or the buffer memory 1003. The memory controller 1002 may also decode the command output from the host device to control an operation for outputting the data stored in the data storage circuit 1001 or the buffer memory 1003. Although FIG. 11 illustrates that the memory controller 1002 is provided as a single functional block, the memory controller 1002 may include two different functional blocks, one for controlling the data storage circuit 1001 comprised of a nonvolatile memory and one for controlling the buffer memory 1003 comprised of a volatile memory. The memory controller 1002 may include the media controller 2 of FIG. 1 or the media controller 62 of FIG. 6.

The buffer memory 1003 may temporarily store the data processed by the memory controller 1002. That is, the buffer memory 1003 may temporarily store the data output from the data storage circuit 1001 or the data to be input to the data storage circuit 1001. In response to a control signal, the buffer memory 1003 may store the data output from the memory controller 1002. The buffer memory 1003 may provide the data output from the data storage circuit 1001 to the memory controller 1002. The buffer memory 1003 may include a volatile memory such as a dynamic random access memory (DRAM), a mobile DRAM, or a static random access memory (SRAM).

The I/O interface 1004 may electrically connect the memory controller 1002 to the external device (e.g., the host). Thus, the memory controller 1002 may receive control signals and data provided from the external device (e.g., the host) through the I/O interface 1004 and may output the data generated from the memory controller 1002 to the external device (e.g., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 12:
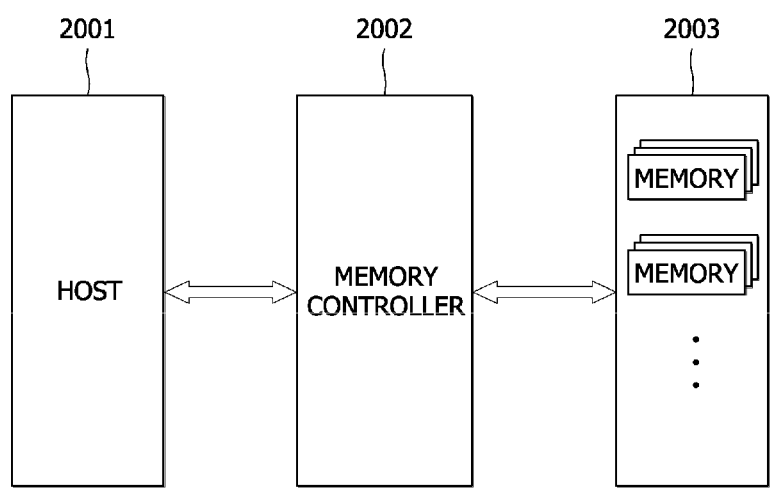
FIG. 12 is a diagram illustrating an example configuration of another electronic system employing at least one of the semiconductor systems shown in FIGS. 1 and 6.

Referring to FIG. 12, an electronic system 2000 according an embodiment may include a host 2001, a memory controller 2002, and a data storage circuit 2003.

The host 2001 may output a request signal and data to the memory controller 2002 to access the data storage circuit 2003. The memory controller 2002 may provide the data, a data strobe signal, a command, addresses and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data output from the data storage circuit 2003 through the memory controller 2002. The host 2001 may include a circuit that corrects errors in the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data output from the host 2001, and may generate and provide the data, the data strobe signal, the command, the addresses and the clock signal to the data storage circuit 2003 in order to control operations of the data storage circuit 2003. In addition, the memory controller 2002 may provide the data output from the data storage circuit 2003 to the host 2001.

The data storage circuit 2003 may include a plurality of memories. The data storage circuit 2003 may receive the data, the data strobe signal, the command, the addresses and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the media 3 of FIG. 1 or the media 63 of FIG. 6.

In some embodiments, the electronic system 2000 may selectively operate any one of the ECC circuits included in the host 2001 and the data storage circuit 2003. Alternatively, the electronic system 2000 may simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

A media controller of a semiconductor system in accordance with an embodiment may transmit data using information of an error correction code (ECC) that is used in a host of the semiconductor system. As a result, a circuit necessary for storing parities may be simplified to improve a data transmission efficiency of the semiconductor system.

What is claimed is:

1. A semiconductor system comprising:
   a host configured to generate first host parities from first host data based on an error check matrix and configured to extract row information from the error check matrix to output the row information; and
   a media controller including a first decoder and a first encoder, and configured to generate first media data and first media parities based on the first host data and the first host parities,
   wherein the first decoder corrects errors in the first host data using the first host parities based on the error check matrix and then output the corrected first host data as first internal data, and the first encoder generates second host data and second host parities from second internal data based on the row information and then transmits the second host data and the second host parities to the host.

2. The semiconductor system of claim 1, wherein:
   the row information includes first row information and second row information;
   the first row information includes information on a first row line of the error check matrix; and
   the second row information includes information on a second row line of the error check matrix.

3. The semiconductor system of claim 1, wherein the first decoder includes:
   a syndrome generation circuit configured to generate a syndrome signal from the first host data and the first host parities; and
   a data correction circuit configured to generate the first internal data from the first host data in response to the syndrome signal.

4. The semiconductor system of claim 1, further comprising a second encoder configured to generate the first media data and the first media parities from the first internal data.

5. The semiconductor system of claim 1, further comprising a second decoder configured to correct errors in second media data using second media parities and then output the corrected second media data as the second internal data.

* * * * *